(12) United States Patent
Tamura et al.

(10) Patent No.: US 6,310,780 B1
(45) Date of Patent: *Oct. 30, 2001

(54) SURFACE MOUNT ASSEMBLY FOR ELECTRONIC COMPONENTS

(75) Inventors: Koetsu Tamura; Hajime Matsuzawa, both of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/187,087

(22) Filed: Nov. 5, 1998

(30) Foreign Application Priority Data

Nov. 5, 1997 (JP) .................................................. 9-303061

(51) Int. Cl.⁷ .............................. H05K 3/32; H01L 23/12
(52) U.S. Cl. ...................... 361/761; 361/760; 361/767; 361/807; 174/260; 174/263; 228/165
(58) Field of Search .................................. 361/760, 761, 361/764, 767, 776, 779, 791, 803, 807–810; 174/164–165; 257/723

(56) References Cited

U.S. PATENT DOCUMENTS

| | | | | |
|---|---|---|---|---|
| 5,055,637 | * | 10/1991 | Hagner | 174/260 |
| 5,109,320 | * | 4/1992 | Bourdelaise et al. | 361/785 |
| 5,368,883 | | 11/1994 | Beaver | 427/96 |
| 5,629,835 | * | 5/1997 | Mahulikar et al. | 361/719 |
| 5,994,648 | * | 11/1999 | Glovatsky et al. | 174/260 |

FOREIGN PATENT DOCUMENTS

| | | |
|---|---|---|
| 93 00 867 U | 5/1994 | (DE) . |
| 0 774 888 A2 | 5/1997 | (EP) . |
| 56-166752 | 11/1981 | (JP) . |
| 58-77074 | 5/1983 | (JP) . |
| 59-182545 | 10/1984 | (JP) . |
| 62-181494 | 8/1987 | (JP) . |
| 1-77370 | 6/1989 | (JP) . |
| 4-201389 | 7/1992 | (JP) . |
| WO 90/13990 | 11/1990 | (WO) . |

OTHER PUBLICATIONS

Patent Abstracts of Japan, vol. 14, No. 457 (E–0986), Oct. 2, 1990.
Leonard Marton Lehrer et al., "Low Profile IC Packaging Method", *Motorola Technical Developments*, vol. 15, May 1992, p. 166.
Patent Abstracts of Japan, vol. 13, No. 343 (E–796), Aug. 2, 1989.
Patent Abstracts of Japan, vol. 15, No. 22 (E–1024), Jan. 18, 1991.
Patent Abstracts of Japan, vol. 9, No. 131 (E–319), Jun. 6, 1985.
Patent Abstracts of Japan, vol. 14, No. 156 (E–908), Mar. 26, 1990.

* cited by examiner

*Primary Examiner*—Jayprakash N. Gandhi
(74) *Attorney, Agent, or Firm*—Sughrue, Mion, Zinn Macpeak & Seas, PLLC

(57) ABSTRACT

A plurality of indentations 21, 22, and 23 are formed in one major surface of a printed board 1. A plurality of electrode pads 41, 42, 43, and 44 are provided on the one major surface and the bottom of the indentations. A plurality of solder portions 91, 92, 93, and 94 are formed on the respective electrode pads. A plurality of electronic components 5, 6, 7, and 8 each having a plurality of terminals are connected to the electrode pads in the corresponding indentations by means of the solder portions.

6 Claims, 4 Drawing Sheets

SURFACE MOUNT ASSEMBLY FOR ELECTRONIC COMPONENTS

BACKGROUND OF THE INVENTION

The present invention relates to a surface mount assembly for electronic components and, more particularly, to a surface mount assembly for electronic components with the supply of solder paste by using a screen printing.

Conventional methods of mounting electronic components on a substrate involve placing a metal mask on a smooth, flat surface of the substrate. Solder paste is screened into openings in the metal mask as solder portions for the subsequent mounting of electronic components on the substrate. Some of the electronic components require a relatively large amount of solder paste while others don't. In the case that the electronic components require the large amount of solder paste, the solder portions are required to have a relatively large size in thickness. However, the screen printing conventionally used is not adapted to supply different amounts of solder paste for different components.

Japanese Patent Laid-Open No. 62-181494 discloses a method of mounting electronic components on a substrate that overcomes the above-mentioned problem. This method employs two masks: a first mask having large windows for supplying a larger amount of solder paste as well as small windows for a smaller amount of solder paste and a second mask having large windows for supplying a larger amount of solder paste. The solder paste is supplied onto the substrate by using the first mask and then the second mask overlapped with the first mask on the top surface thereof. This approach is hereinafter referred to as a first prior art.

There is another method that overcomes the above-mentioned problem in which a plurality of openings are formed in a metal mask for screen printing at the position corresponding to the electronic components to be mounted on a substrate. The openings are varied in diameter for supplying different amounts of solder paste to the substrate for the different electronic components. This approach is hereinafter referred to as a second prior art.

The first prior art requires two or more masks depending on the desired amount of the solder paste for the different electronic components. On the other hand, the second prior art requires the metal mask to have a uniform thickness because the amount of the solder paste to be supplied on the substrate is determined according to the difference in diameter. Thus, the amount of the solder paste in the openings would be suitable for one or some of the electronic components and may not be good for the remainders. Since solder paste spread away in the openings, the difference in diameter is not a sufficient factor for precise control of the amount of the solder paste in the openings.

Furthermore, since conventional substrates have a uniform thickness, a connector cannot be attached to a side of the substrate when the thickness exceeds a certain limit.

SUMMARY OF THE INVENTION

An object of the present invention is to provide a surface mount assembly on which electronic components are mounted on solder portions of various amounts on a substrate that are desirable for individual components.

Another object of the present invention is to provide a substrate suitable for the above-mentioned surface mount assembly for electronic components.

It is yet another object of the present invention to provide a method of mounting electronic components as the above-mentioned surface mount assembly for electronic components.

It is still another object of the present invention to provide a surface mount assembly for electronic components in which a thickness of a substrate is not a limitation to the choices of a connector to be attached to a side of the substrate.

A surface mount assembly for electronic components according to a first invention comprises a substrate on which an electronic component is to be mounted; an indentation formed in one major surface of the substrate; electrode pads provided on the bottom of the indentation; solder portions provided on the respective electrode pads; and an electronic component having a plurality of terminals. The terminals of the electronic component are connected to the corresponding electrode pads with the solder portions.

A surface mount assembly for electronic components according to a second invention comprises a substrate on which electronic components are to be mounted; indentations formed in one major surface of the substrate for the respective electronic components; electrode pads provided on the bottom of each indentation; solder portions provided on the respective electrode pads; and electronic components each having a plurality of terminals. The electronic components correspond to the indentations. The terminals of the individual electronic components are connected to the corresponding electrode pads with the solder portions.

A surface mount assembly for electronic components according to a third invention comprises a substrate having at least one electronic component mounted thereon; a notch formed in one major surface of the substrate along the perimeter thereof; a first electrode pad provided on the bottom of the notch; a second electrode pad provided on another major surface opposing to the one major surface of the substrate at the position corresponding to the first electrode pad; and an electronic component having first and second terminals connected to the first and the second electrode pads, respectively.

The substrate according to the present invention has a component mount area on which an electronic component is to be mounted. The substrate has an indentation formed in the component mount area on at least one major surface. The indentation has a dimension determined depending on a size of the electronic component to be mounted.

A method of mounting electronic components on a substrate is applicable to mount electronic components each having a plurality of terminals on a substrate having indentations formed in one major surface thereof and electrode pads provided on the bottom of each indentation.

The method of mounting electronic components on the substrate according to an aspect of the present invention comprises the steps of: placing on the substrate a metal mask having a plurality of openings formed at the positions corresponding to the electrode pads; supplying solder paste to the electrode pads through the openings in the metal mask and then removing the metal mask; mounting the electronic components on the substrate such that the terminals of the components correspond to the respective electrode pads in the corresponding indentations; and melting the solder paste to connect the terminals of the electronic components with the electrode pads.

DESCRIPTION OF THE PREFERRED EMBODIMENT

The following description is directed to a surface mount assembly for electronic components, a substrate, and a method of mounting electronic components on a substrate, all of which are in accordance with a preferred embodiment of the present invention.

Figure 1:
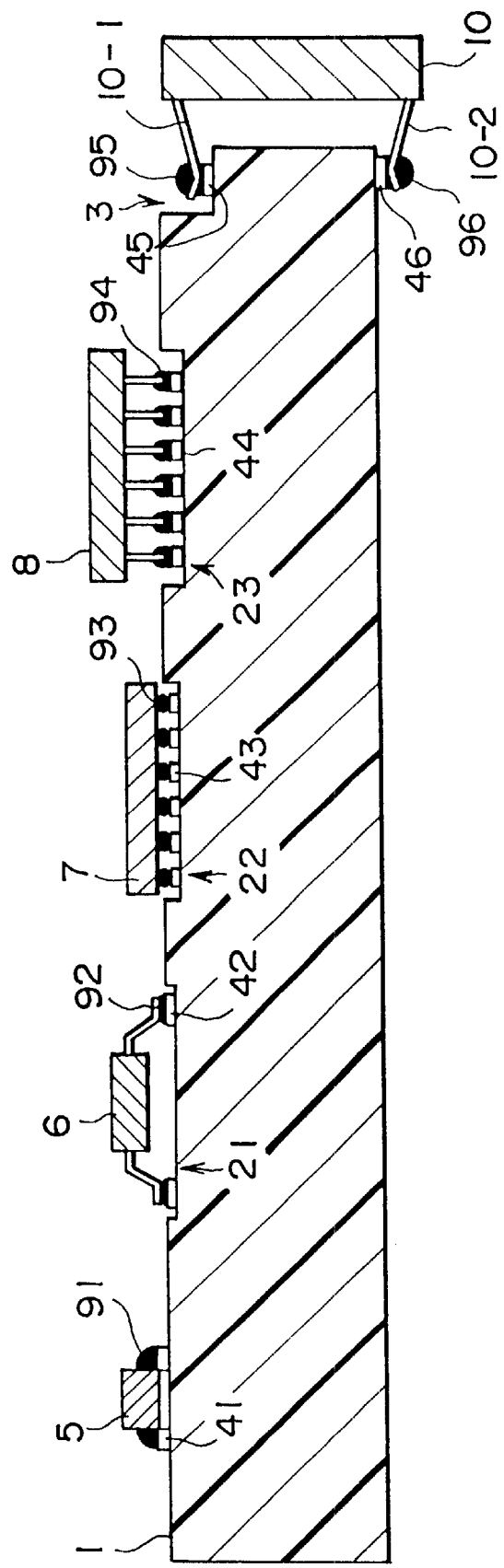
FIG. 1 is a cross sectional view showing a surface mount assembly for electronic components according to a first embodiment of the present invention.

Referring to FIG. 1, a plurality of indentations 21, 22, and 23 are formed in a major surface of a printed board 1. A notch 3 is formed in the printed board 1 along the perimeter thereof. A plurality of electrode pads 41, 42, 43, 44, and 45 are provided on the major surface of the substrate 1, in the indentations 21, 22, and 23 and in the notch 3. The printed board 1 may be formed of, for example, a glass epoxy-based resin such as polyimide. The printed board 1 has a thickness of 2.5 to 5 millimeters and, more preferably, the thickness of 2.5 millimeters.

The indentations 21, 22, and 23 are formed in the printed board 1 where a plurality of electronic components are mounted. The indentations 21, 22, and 23 have the dimension and the depth determined depending on the size of the corresponding electronic components to be mounted on. More specifically, the depth of the indentations 21, 22, and 23 is determined according to the desired amount of solder paste required to mount the corresponding electronic components.

The electronic components to be mounted on may be, for example, a chip element 5, a small outline package (SOP) 6, a ball grid array (BGA) 7, and a surface mount type pin grid array (PGA) 8.

The chip element 5 may be a chip capacitor or a chip resistance that has a plurality of terminals. The chip element 5 is provided on the major surface of the substrate 1 at the position other than the indentations. A plurality of electrode pads 41 are provided on the region of the major surface where the chip element 5 is to be mounted. Each of the electrode pads 41 is rectangular in configuration. The electrode pads 41 are away from each other at a gap of from 0.4 to 0.635 millimeters. The electrode pads 41 are connected to the respective terminals of the chip element 5 by means of solder portions 91. The solder portions 91 are provided in an amount suitable for connecting the electrode pads 41 to the respective terminals of the chip elements 5.

The SOP 6 has a plurality of terminals and is provided in the indentation 21. The indentation 21 has a depth of from 50 to 100 microns. A plurality of electrode pads 42 are provided in the indentation 21 on the bottom thereof. The electrode pads 42 each has a rectangular shape. The electrode pads 42 are away from each other at a gap of from 0.4 to 0.635 millimeters. The electrode pads 42 are connected to the respective terminals of the SOP 6 by means of solder portions 92. The solder portions 92 are provided in an amount suitable for connecting the electrode pads 42 to the respective terminals of the SOP 6.

The BGA 7 has a plurality of terminals and is provided in the indentation 22. The indentation 22 has a depth of from 100 to 150 microns. A plurality of electrode pads 43 are provided in the indentation 22 on the bottom thereof. The electrode pads 43 each has a circular or generally circular shape. The circle itself or a circular configuration that encloses the electrode pad has a diameter of from 0.6 to 0.7 millimeters. The electrode pads 43 are away from each other at a gap of approximately 1.25 millimeters. The electrode pads 43 are connected to the respective terminals of the BGA 7 by means of solder portions 93. The solder portions 93 are provided in an amount suitable for connecting the electrode pads 43 to the respective terminals of the BGA 7.

The surface mount type PGA 8 has a plurality of terminals and is provided in the indentation 23. The indentation 23 has a depth of from 150 to 250 microns. A plurality of electrode pads 44 are provided in the indentation 23 on the bottom thereof. The electrode pads 44 each has a circular or generally circular shape. The circle itself or a circular configuration that encloses the electrode pad has a diameter of from 0.6 to 0.7 millimeters. The electrode pads 44 are away from each other at a gap of approximately 1.25 millimeters. The electrode pads 44 are connected to the respective terminals of the surface mount type PGA 8 by means of solder portions 94. The solder portions 94 are provided in an amount suitable for connecting the electrode pads 44 to the respective terminals of the surface mount type PGA 8.

The notch 3 is formed in a connector mount area along the perimeter of the major surface of the printed board 1. The depth of the notch 3 is adjusted such that the height of the printed board 1 in the area where the notch 3 is formed is from 1.6 to 2.2 millimeters. A plurality of electrode pads 45 are provided in the notch 3. A plurality of electrode pads 46 are provided on the back surface of the printed board 1. The electrode pads 46 are provided at the positions corresponding to the electrode pads 45.

A connector 10 is provided over a side of the printed board 1. The connector 10 has two groups of leads 10-1 and 10-2. A connector mount portion defined by the notch 3 is interposed between the leads 10-1 and 10-2. The leads 10-1 are connected to the electrode pads 45 by means of solder portions 95 while the leads 10-2 are connected to the electrode pads 46 by means of solder portions 96.

In this embodiment, the printed board 1 has the indentations 21, 22, and 23 having different depths, corresponding to the electronic components to be mounted on. This means that the desired amount of solder paste are supplied to the printed board 1 for each of the electronic components. As a result, the connection between the electrode pads and the electronic components become more reliable and improved.

A method of mounting electronic components on a substrate according to the present invention is described below. The electrode pads 45 and 46 are provided in the connector mount area in the printed board 1. The solder portions 95 and 96 are formed on the top of the electrode pads 45 and 46, respectively. The solder paste may be applied to the electrode pads as the solder portions by means of, for example, a dispenser or a printing technique that achieves local printing with a partial metal mask.

Figure 2:
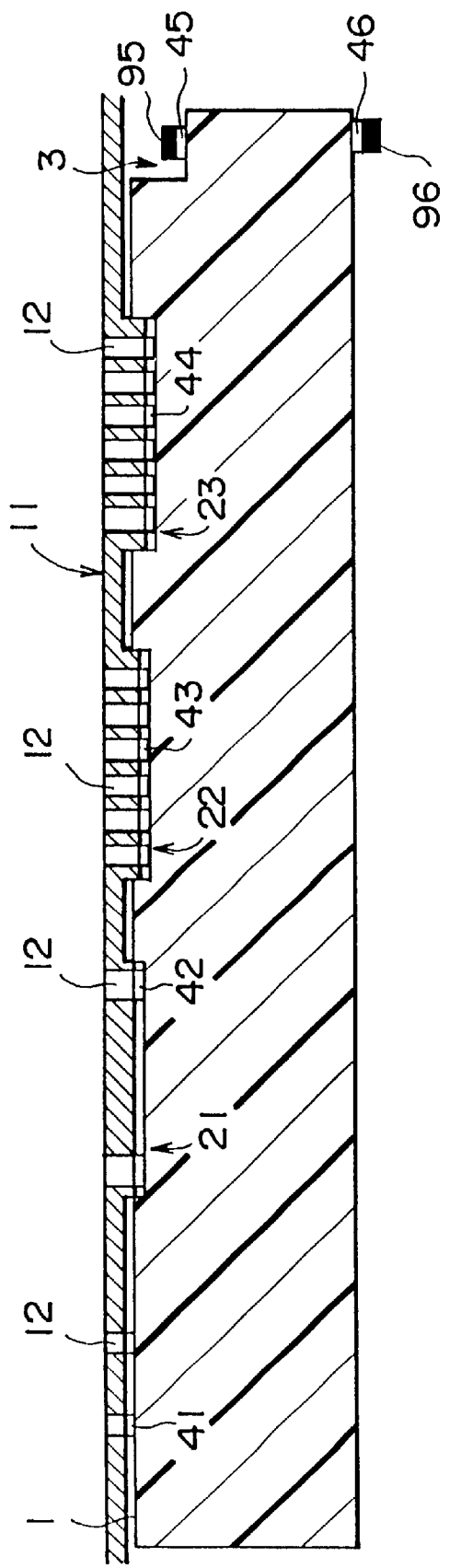
FIG. 2 is a cross sectional view for use in describing a method of mounting electronic components on a substrate according to the present invention.

Referring to FIG. 2, the electrode pads 41, 42, 43, 44, 45, and 46 are previously provided on the substrate 1. A metal mask 11 for solder printing is placed on the printed board 1. The thickness of the metal mask 11 is varied portion by portion in association with the indentations 21, 22, and 23 formed in the printed board 1. More specifically, the metal mask 11 has a non-uniform and area-dependent thickness determined depending on the mount area for the electronic components. The metal mask 11 has a thickness of from approximately 50 to 150 micrometers at the position corresponding to the mount area for the chip 5. The metal mask 11 has a thickness of from approximately 100 to 150 micrometers at the position corresponding to the mount area for the SOP 6. The metal mask 11 has a thickness of from approximately 150 to 200 micrometers at the position corresponding to the mount area for the BGA 7. The metal mask 11 has a thickness of from approximately 200 to 300 micrometers at the position corresponding to the mount area for the surface mount type PGA 8. The metal mask 11 has a plurality of openings 12 formed therein at the positions corresponding to the electrode pads 41, 42, 43, and 44.

Figure 3:
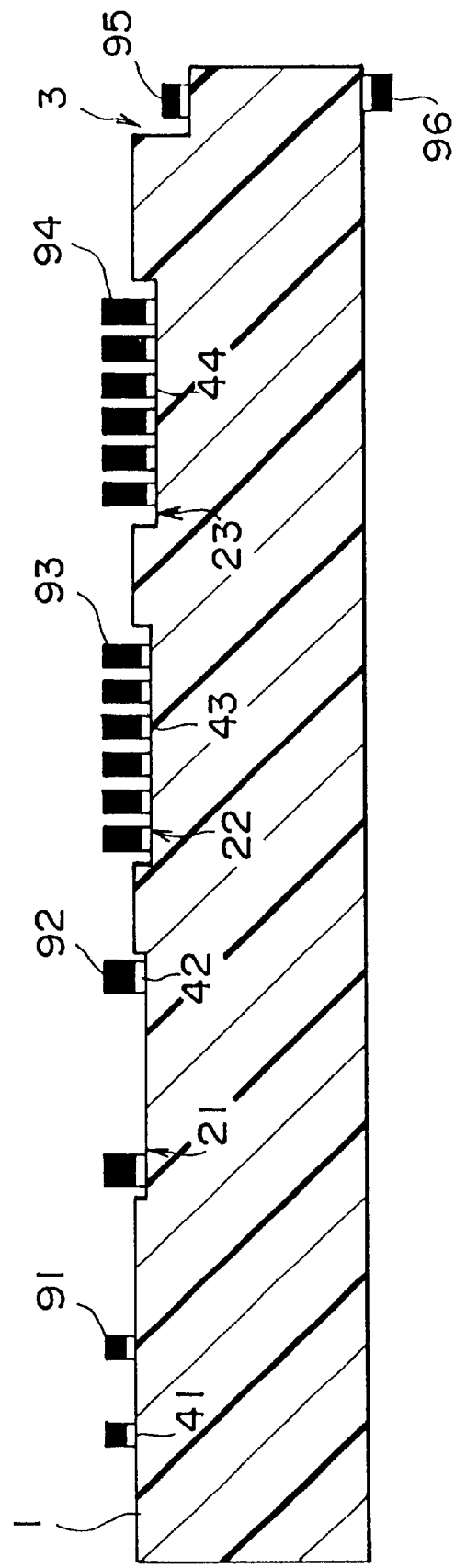
FIG. 3 is a cross sectional view for use in describing the operation continued from FIG. 2.

Referring to FIG. 3, desired amount of solder pastes are supplied, at first, to the top of the electrode pads 45 and 46 as the solder portions 95 and 96. Next, the solder is screened on the printed board 1 where the electrode pads 41, 42, 43, and 44 are provided. The screening of the solder is achieved in the following manner. Solder paste is supplied on the metal mask 11 and is spread out by means of a squeegee. Thus the solder paste is filled in the openings 12 formed in the metal mask 11. A desired amount of solder paste is supplied to the electrode pads 41, 42, 43, and 44. The solder paste has the identical or generally identical level at the respective positions of the electrode pads 41, 42, 43, and 44, though depending on the thickness of the metal mask 11 and the depth of the indentations 21, 22, and 23 in the printed board 1. In the manner described above, the solder paste is supplied to the top of the electrode pads 41, 42, 43, and 44, as the solder portions 91, 92, 93, and 94, respectively. The metal mask 11 is removed after the solder screening.

Figure 4:
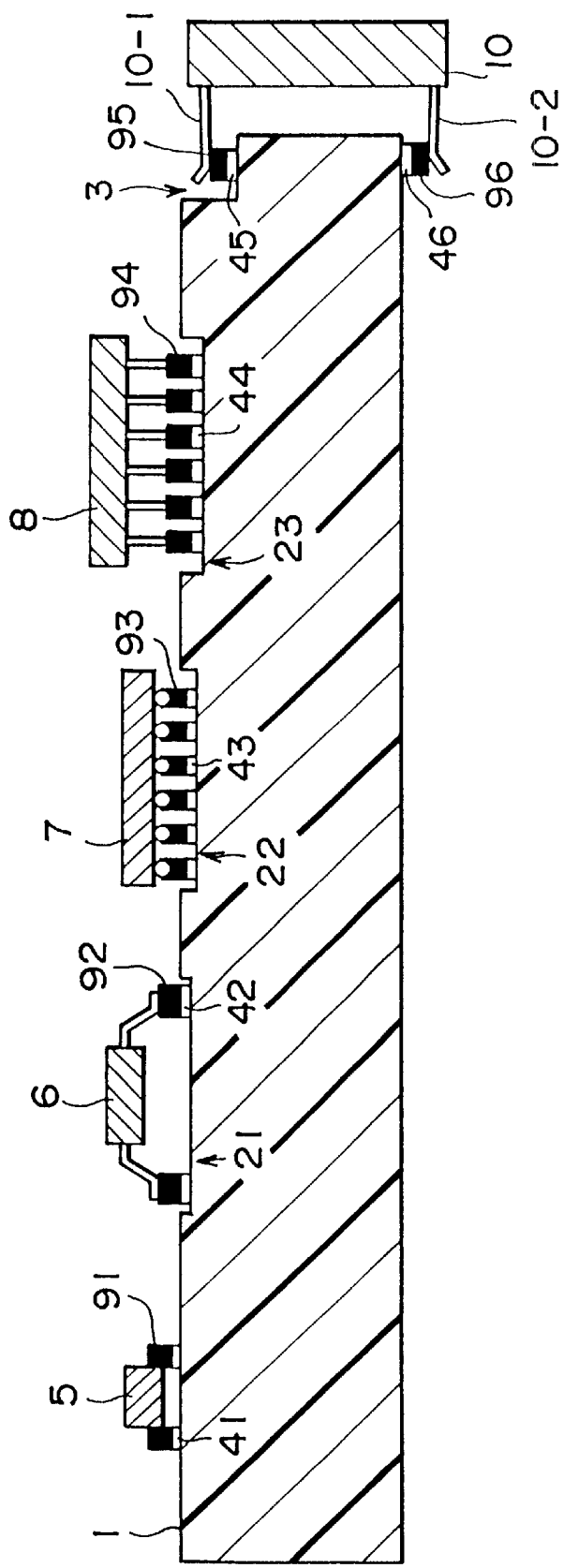
FIG. 4 is a cross sectional view for use in describing the operation continued from FIG. 3.

Referring to FIG. 4, the electronic components are mounted onto the electrode pads 41, 42, 43, and 44. The chip element 5, the SOP 6, the BGA 7, and the surface mount type PGA 8 are mounted by means of an automatic mounter. An electronic component such as a quad flat package (QFP) or a plastic leaded chip carrier (PLCC) may also be mounted on. The connector 10 is mounted manually or by means of a jig.

Turning back to FIG. 1, the electronic components 5, 6, 7, and 8 are soldered by means of reflow. The reflow technique used is vapor phase soldering (VPS). With the VPS technique, a substance is entirely uniformly heated independent of a size and/or a shape of the substance. This is important for good soldering. In particular, the electrode pads are provided with a different desired amount of the solder paste, the VPS technique contribute to applying the solder paste with a good filet shape and a high quality.

As mentioned above, according to the present embodiment, the printed board 1 has the indentations 21, 22, and 23 corresponding to the electronic components 5, 6, 7, and 8. In addition, the metal mask 11 for the solder screening is varied in thickness depending on the mount area for the electronic components 5, 6, 7, and 8. This makes it possible to provide a different desired amount of the solder paste on the electrode pads for each of the electronic component.

In this embodiment, the notch 3 is formed in one major surface of the printed board 1. However, notches may be formed in two opposing major surfaces of the printed board 1. In this event, the thickness of the printed board 1 where the notches are formed is adjusted to be from 1.6 to 2.2 millimeters. Each notch is provided with a plurality of electrode pads which are connected to leads of the connector 10.

In addition, in this embodiment, the solder portions 95 and 96 are first provided on the electrode pads 45 and 46, respectively, and then the solder screening is conducted by using the metal mask 11. However, the solder paste may be supplied to the electrode pads 45 and 46 after the solder screening with the metal mask 11.

Furthermore, the diameter of each opening 12 may be controlled in addition to the thickness of the metal mask 11, on the basis of the desired amount of the solder paste.

As apparent from the above description, the present invention provides a plurality of indentations in the substrate at the position corresponding to the respective electronic components. In addition, the thickness of the metal mask is varied portion by portion for the respective mount areas for the electronic components. This results in a desired amount of solder paste to be provided on the electrode pads for the respective electronic components. Therefore, reliable, good connections are obtained.

What is claimed is:

1. A surface mount assembly, comprising:
   a substrate having a major surface in which are provided a first indentation having a first depth, and a second indentation having a second depth that is greater than said first depth;
   a plurality of electrode pads provided on a bottom of each of said first and said second indentations;
   a plurality of solder portions provided respectively on said plurality of electrode pads; and
   a first electronic component and a second electronic component, each having a plurality of terminals that are respectively connected to said plurality of electrode pads with said plurality of solder portions,
   wherein said plurality of solder portions provided respectively in said first and said second indentations have top surfaces that are contained in a same plane.

2. A surface mount assembly for electronic components as claimed in claim 1, wherein said first indentation has a dimension determined in accordance with a size of said first electronic component, and said second indentation has a dimension determined in accordance with a size of said second electronic component.

3. A surface mount assembly for electronic components as claimed in claim 1, wherein the amount of said plurality of solder portions in each of said first and said second indentations is determined in accordance with a size of a corresponding one of said first and said second electronic components.

4. A surface mount assembly for electronic components as claimed in claim 1, wherein each of said plurality of electrode pads is provided with solder paste in an amount required for mounting a corresponding one of said first and said second electronic components on said substrate.

5. A method of mounting electronic components on a substrate, said electronic components each having a plurality of terminals, said substrate having a plurality of indentations with different depths formed in one major surface thereof and a plurality of electrode pads respectively provided on bottoms of said plurality of indentations, said method comprising the steps of:
   placing on said substrate a metal mask having a plurality of openings formed at positions corresponding to said electrode pads;
   supplying solder paste to said electrode pads through said openings in said metal mask in amounts such that top surfaces of said solder paste provided on each of said electrode pads are contained in a same plane, and then removing said metal mask;
   mounting said electronic components on said substrate such that said terminals of said electronic components respectively correspond to said respectively provided electrode pads in said indentations; and
   melting said solder paste to connect said terminals of said electronic components with said electrode pads.

6. The method of claim 5, further comprising the step of forming said mask to have thicknesses that correspond to amounts of said solder paste that are respectively supplied to each of said indentations.

* * * * *